United States Patent
Ma et al.

(10) Patent No.: US 7,619,453 B2
(45) Date of Patent: Nov. 17, 2009

(54) DELAY-LOCKED LOOP (DLL) SYSTEM FOR DETERMINING FORWARD CLOCK PATH DELAY

(75) Inventors: Yantao Ma, Boise, ID (US); Jeffrey P Wright, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/366,512

(22) Filed: Feb. 5, 2009

(65) Prior Publication Data

US 2009/0146712 A1 Jun. 11, 2009

Related U.S. Application Data

(63) Continuation of application No. 11/697,858, filed on Apr. 9, 2007, now Pat. No. 7,495,487.

(51) Int. Cl.
*H03L 7/06* (2006.01)
(52) U.S. Cl. ..................................... 327/158
(58) Field of Classification Search ................. 327/155, 327/156, 157, 158, 159
See application file for complete search history.

(56) References Cited

U.S. PATENT DOCUMENTS

| | | | |
|---|---|---|---|
| 7,212,053 B2 | 5/2007 | Gomm et al. | |
| 7,332,950 B2 | 2/2008 | Blodgett | |
| 7,368,965 B2 * | 5/2008 | Drexler et al. | 327/158 |
| 7,375,565 B2 | 5/2008 | Kwak | |
| 7,492,200 B2 * | 2/2009 | Na | 327/158 |

* cited by examiner

*Primary Examiner*—Jeffrey S Zweizig
(74) *Attorney, Agent, or Firm*—Knobbe, Martens, Olson & Bear LLP

(57) ABSTRACT

A delayed locked loop (DLL) system and method for determining a forward clock path delay are disclosed. One embodiment of the DLL system includes a delay line having a plurality of delay stages. The DLL system also includes a measure shot device configured to determine a forward clock path delay of the DLL system. The measure shot device is configured to provide a calibration sequence into the DLL loop and to detect the calibration sequence after the calibration sequence has passed through the DLL loop. The measure shot device is further configured to count the number of clocks for a period of time between providing and detecting the calibration sequence. The number of clocks can be used to calibrate components of the DLL system.

25 Claims, 7 Drawing Sheets

DELAY-LOCKED LOOP (DLL) SYSTEM FOR DETERMINING FORWARD CLOCK PATH DELAY

CROSS-REFERENCE TO RELATED APPLICATIONS

This application is a continuation of U.S. patent application Ser. No. 11/697,858, filed Apr. 9, 2007, now U.S. Pat. No. 7,495,487, the disclosure of which is hereby incorporated by reference in its entirety herein.

BACKGROUND OF THE INVENTION

1. Field of the Invention

Embodiments of the invention relate to electronic devices, and more particularly, to electronic devices including a delay-locked loop (DLL).

2. Description of the Related Art

High speed electronic devices such as DRAM are often provided with external or reference clock signals for timing the operations of their internal components. When an external clock signal is propagated to internal components, a time delay of the clock signal occurs. The internal components may not be well synchronized with the external clock signal, which can affect the performance of the internal components at relatively high speeds.

In addition, various components in an electronic device can have different manufacturing parameters. Thus, the components in an electronic device may not be relatively well synchronized even though they are clocked by the same external or reference clock signal. In addition, variations in operating conditions such as operating temperature and external power supply may also vary propagation delay, resulting in changes to clock delay.

FIG. 1 illustrates a conventional delay-locked loop (DLL) system 100. The DLL system 100 includes an input buffer 105, a delay line 115, a clock tree 117, an output buffer 120, a replica model 125, a phase detector 140, a shift register controller 142, a shift register 145, and internal circuits 170. The input buffer 105 receives an external clock signal CLK and the output buffer 120 outputs an output clock signal CLK_DLL.

The delay line 115, the replica model 125, the phase detector 140, the shift register controller 142, and the shift register 145 together form a delay-locked loop (DLL). The DLL is configured to synchronize the external clock signal CLK with the output clock signal CLK_DLL.

The input buffer 105, the delay line 115, the clock tree 117, and the output buffer 120 together form a forward or internal clock path. In the context of this document, the term "forward clock path delay" refers to a clock delay occurring along the forward clock path from the input buffer 105 to the output buffer 120. Other systems can have additional components along their forward clock path. In such cases, part of the forward clock path delay can be associated with the additional components.

The input buffer 105 receives the external clock signal CLK. The input buffer 105 generates a reference clock signal clk with a delay from the external clock signal CLK. The input buffer 105 provides the delay line 115 and the phase detector 140 with the reference clock signal clk.

The delay line 115 receives the reference clock signal clk from the input buffer 105 and delays the signal. The delay line 115 includes a plurality of delay stages, for selection of a desired delay from the reference clock signal clk. The delay line 115 can include a daisy chain of logic gates.

The clock tree 117 receives the delayed signal from the delay line 115. The clock tree 117 is configured to distribute clocks for timing the internal circuits 170. The clock tree 117 also provides an output signal to the output buffer 120.

The output buffer 120 receives the output signal from the clock tree 117. The output buffer 120 provides an output signal CLK_DLL which is delayed from the clock tree output signal.

The replica model 125 receives a delayed clock signal from the delay line 115 and further delays the delayed signal. The replica model 125 is configured to emulate delays along the forward clock path of the system 100 except for a delay associated with the delay line 115. In the illustrated system 100, the replica model 125 can include a dummy output buffer, a dummy clock tree, a dummy input buffer, and additional gates (not shown) to form a replica of the forward clock path delay. The replica model 125 provides a replica model output signal to the phase detector 140.

The phase detector 140 compares the reference clock signal clk with the replica model output signal from the replica model 125. The phase detector 140 generates a comparison signal corresponding to a phase difference between the reference clock signal clk and the replica model output signal. The phase detector 140 provides the comparison signal to the shift register controller 142.

The shift register controller 142 receives the comparison signal, and controls the shift register 145 in response to the comparison signal. The shift register 145 is configured to select the delay amount of the delay line 115.

BRIEF DESCRIPTION OF THE DRAWINGS

The embodiments will be better understood from the Detailed Description of Embodiments and from the appended drawings, which are meant to illustrate and not to limit the embodiments, and wherein.

DETAILED DESCRIPTION OF EMBODIMENTS

Figure 1:
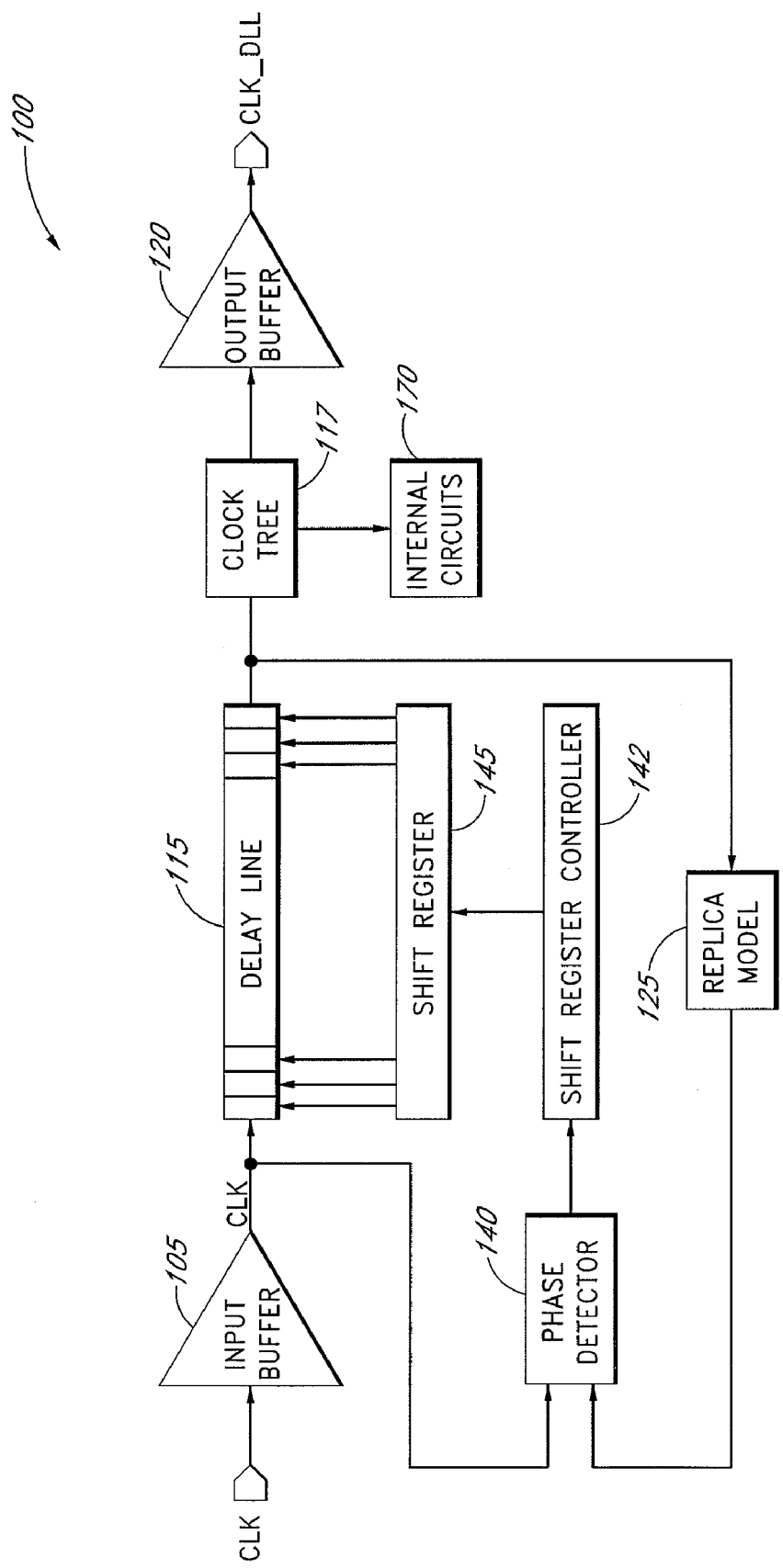
FIG. 1 is a schematic block diagram of a conventional delay-locked loop (DLL) system.

High-speed electronic devices often demand a minimal delay along the forward clock path so as to provide relatively low latency, relatively good timing margin, and relatively fast data throughput. Optimizing a delay along the delay line of a DLL is a good design practice. However, the delay is susceptible to changes in various factors such as external clock frequency, process model, process, voltage, and temperature variations (PVT), external power supply, internal power bussing voltage, and the like. Therefore, there is a need to calibrate a DLL configuration in response to such changes.

During normal operation, an external clock signal is provided to a DLL system. However, when the DLL system is being calibrated, the external clock signal is stopped to clear the DLL loop. A calibration signal is applied again to the DLL system. Delays along the DLL loop is determined by detecting a single (or first) edge of the clock signal when the calibration signal has turned around the DLL loop. This calibration method prevents the DLL system from being used during calibration because of the absence of clocking while the DLL is being cleared.

Measure Shot Device for Determination of Forward Path Delay

A DLL system according to one embodiment can have two modes: 1) a normal operation mode and 2) a calibration mode. The DLL can select one of the modes using a multiplexer. During the normal operation mode, an external clock signal is provided to the system for timing internal circuits thereof. During the calibration mode to be described in greater detail later in connection with FIGS. 2-6, a calibration sequence is used, which permits at least partial operation, i.e., clocking, of the DLL system and circuits using the DLL system. The DLL system can be calibrated based on the clock delays. In one embodiment, the DLL system can be calibrated while it is idle (e.g., when a DRAM is not in read operation) without discontinuing supply of the external clock signal to clear its DLL loop.

In one embodiment, a DLL system is provided with a measure shot device for use in the calibration mode. The measure shot device may also be referred to as a "calibration device" in the context of this document. The measure shot device is configured to determine the forward clock path delay of the DLL system. The measure shot device is configured to generate and apply a calibration sequence to the DLL system and to detect the sequence after the sequence has turned around the DLL system loop. The measure shot device is configured to determine the forward clock path delay in terms of the number of reference clocks. This number of reference clocks can be referred to as an "N value" in the context of this document.

The measure shot device can determine the forward clock path delay while the DLL system is idle without affecting the operation of the DLL system. In addition, the measure shot device can provide an N value when there is a change in the DLL system's ambient environment, or external or internal component variables. The N value can be used for adjusting various components of the DLL system to optimize the performance of the DLL system under varying conditions. The N value can also be used for optimizing internal components to which the DLL system supplies a clock signal. A DLL system including the measure shot device can apply to various electronic devices, including, but not limited to, memory devices (e.g., DRAM) and communication devices (e.g., wireless mobile devices).

Figure 2:
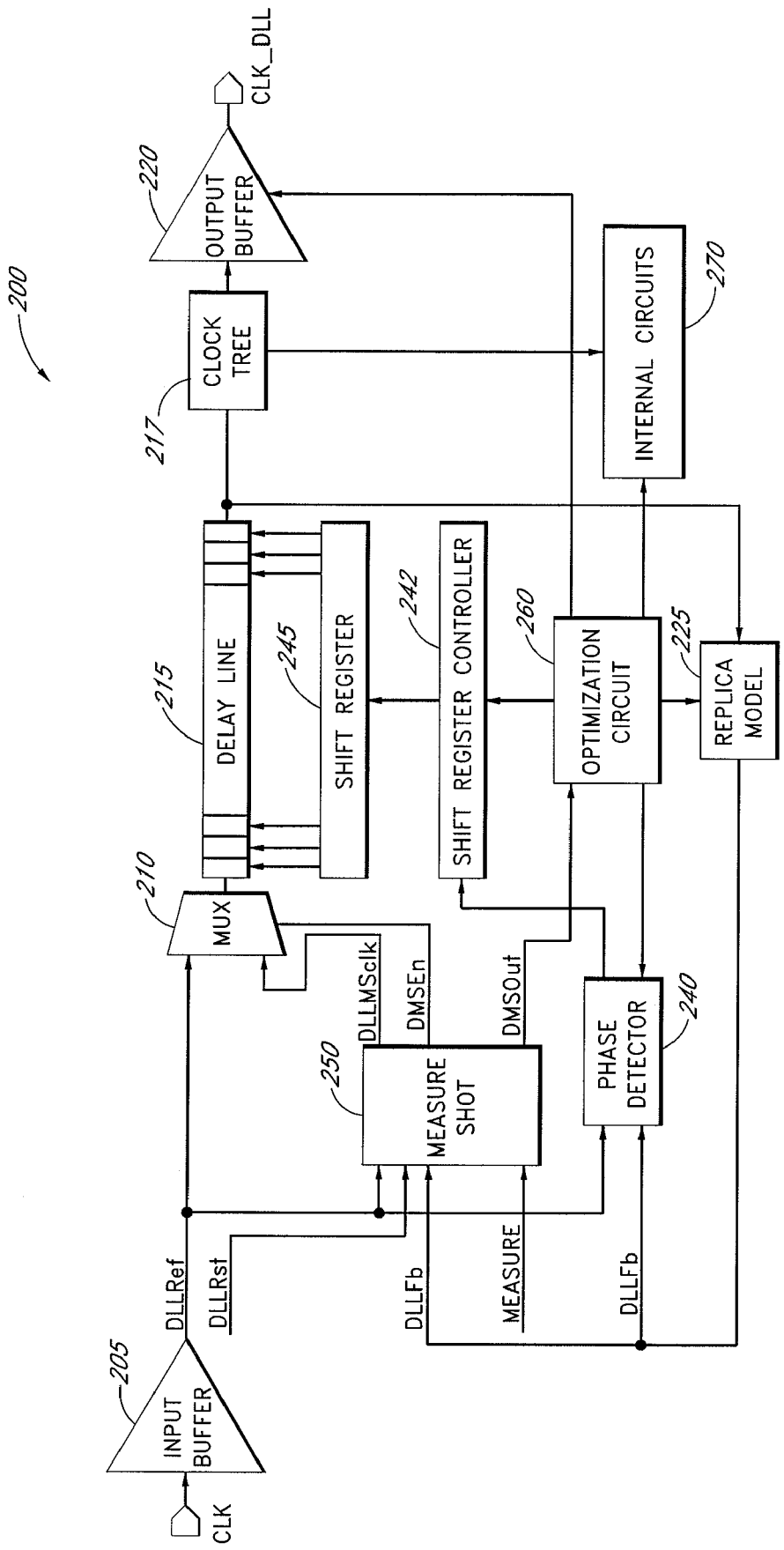
FIG. 2 is a schematic block diagram of one embodiment of a delay-locked loop (DLL) system.

FIG. 2 illustrates one embodiment of a delay-locked loop (DLL) system 200. The DLL system 200 includes an input buffer 205, a multiplexer 210, a delay line 215, a clock tree 217, an output buffer 220, a replica model 225, a phase detector 240, a shift register controller 242, a shift register 245, a measure shot device 250, an optimization circuit 260, and internal circuits 270. The input buffer 105, the multiplexer 210, the delay line 215, the clock tree 217, and the output buffer 220 together form a forward clock path. In FIG. 2, a forward clock path delay refers to a clock delay occurring while a clock signal travels along the forward clock path.

The input buffer 205 receives an external clock signal CLK. The input buffer 205 is configured to generate a reference clock signal DLLRef which is delayed from the external clock signal CLK. The input buffer 205 provides the reference clock signal DLLRef to the multiplexer 210, the measure shot device 250, and the phase detector 240.

The multiplexer 210 receives the reference clock signal DLLRef from the input buffer 205 and a measure shot clock signal DLLMSclk from the measure shot device 250 at the inputs thereof. The multiplexer 210 also receives a measure shot enable signal DMSEn from the measure shot device 250 at the selector input thereof. The multiplexer 210 is configured to select the reference clock signal DLLRef for the delay line 215 during the normal operation of the DLL system 200. On the other hand, the multiplexer 210 is configured to select the measure shot clock signal DLLMSclk from the measure shot device 250 for the delay line 215 when determining the forward clock path delay of the DLL system 200. When the measure shot device 250 intends to apply the measure shot clock signal DLLMSclk to the DLL system loop, the measure shot enable signal DMSEn is activated for the multiplexer 210.

The delay line 215 receives an output clock signal from the multiplexer 210. The output clock signal of the multiplexer 210 can be either the reference clock signal DLLRef or the measure shot clock signal DLLMSclk, depending on whether the measure shot enable signal DMSEn is activated for the multiplexer 210.

The delay line 215 is configured to delay the output signal from the multiplexer 210. The delay line 215 includes a plurality of delay stages which can be added to or eliminated from the forward clock path, to change the propagation delay through the delay line 215. In one embodiment, the delay line 215 can include a daisy chain of logic gates. A skilled artisan will appreciate that various configurations of logic gates can be adapted for forming the delay line 215.

The clock tree 217 receives the delayed signal from the delay line 215. The clock tree 217 is configured to distribute clocks for timing the internal circuits 270. The internal circuits 270 can include any type of circuits using clock signals distributed by the clock tree 217. In the illustrated embodiment, the internal circuits 270 can include output circuits of a DRAM. The clock tree 217 also provides an output signal to the output buffer 220.

The output buffer 220 receives an output signal from the clock tree 217. The output buffer 220 provides an output signal CLK_DLL which is delayed from the clock tree output signal.

The replica model 225 receives the delayed clock signal from the delay line 215, and is configured to further delay the delayed signal to generate a feedback signal DLLFb. The configuration of the replica model 225 can be as described above with respect to that of the replica model 125 of FIG. 1.

The phase detector 240 is configured to compare the reference clock signal DLLref from the input buffer 205 with the feedback signal DLLFb from the replica model 225. The phase detector 240 generates a comparison signal corresponding to a phase difference between the reference clock signal DLLref and the feedback signal DLLFb. The phase detector 240 provides the comparison signal to the shift register controller 242.

The shift register controller 242 receives the comparison signal. The shift register controller 242 is configured to control the shift register 245 in response to the comparison signal. The shift register 245 is configured to select the delay amount of the delay line 215. Other circuits for control will be readily determined by one of ordinary skill in the art.

The measure shot device 250 receives the reference clock signal DLLRef, the feedback signal DLLFb, a reset signal DLLRst, and a measure initiation signal MEASURE. The measure shot device 250 also outputs a measure shot clock signal DLLMSclk, a measure shot enable signal DMSEn, and a measure shot output signal DMSOut.

The measure shot device 250 is configured to generate the measure shot enable signal DMSEn and the measure shot clock signal DLLMSclk in response to the measure initiation signal MEASURE. The measure initiation signal MEASURE is supplied by a controller (not shown) when the DLL system 200 is idle and/or when there is a need to calibrate the DLL system 200. In another embodiment, the measure initiation signal MEASURE can be periodically supplied. The measure shot enable signal DMSEn serves to control the multiplexer 210 so that the measure shot clock signal DLLMSclk is applied to the DLL system 200. The measure shot clock signal DLLMSclk can carry a calibration sequence. In the context of this document, the calibration sequence can also be referred to as a "measure shot (MS) sequence."

The measure shot sequence can have any arbitrary sequence which is encoded. In one embodiment, the measure shot sequence can have a sequence different from the external clock sequence (e.g., 0101010 . . . ). This configuration allows the measure shot sequence to be applied and detected without clearing the external clock from the DLL loop before applying the sequence thereto. In another embodiment, the measure shot sequence can also be different from some interrupt of the clock sequence (e.g., 1000101010 . . . ). For example, the measure shot sequence can include any string containing 0x110, 11x01, 111101, 11011, 100011, 001100, 1000100, 110010001101111, etc. The measure shot sequence can have a length of at least 5 reference clock cycles. The measure shot sequence can have a frequency different from that of the external clock sequence. In one embodiment, the measure shot sequence can have a frequency between fclk_min/Nmin and fclk_max. "fclk_min" is the minimum frequency specified by the DLL system. "Nmin" is the corresponding loop number at this minimal frequency. "fclk_max" is the maximal frequency specified by the DLL system. The measure shot sequence may not be a sequence having a long string of consecutive binary 0's and/or consecutive binary 1's (e.g., 000 . . . 000111 . . . 111). In one embodiment, the measure shot sequence may not have 16 or more consecutive binary 0's before a binary 1. In another embodiment, the measure shot sequence may not have more than 6 consecutive binary 1's.

The measure shot device 250 is also configured to monitor the feedback signal DLLFb, and to detect the measure shot sequence returning to it after going through the DLL system loop. The measure shot device 250 can monitor the feedback signal DLLFb for a period of time sufficient for the measure shot sequence to turn around the DLL loop. In one embodiment, the measure shot device 250 can monitor the feedback signal DLLFb for a period of about 20 to about 30 reference clock cycles. The measure shot device 250 is also configured to count the number N of reference clocks between generating and detecting the measure shot sequence, thereby determining the forward clock path delay of the DLL system 200.

The measure shot device 250 generates the measure shot output signal DMSOut which provides information on the forward clock path delay. The information can include the N value of the forward clock path. The N value can serve as an index value indicative of filtering window size, redundancy of coarse delay line, relationship between the external clock signal CLK and data strobe signal/data signal (DQS/DQ). The N value can also be used to provide better full chip timing budget/margin analysis and easier debugging for product engineering.

The optimization circuit 260 receives the measure shot output signal DMSOut. The optimization circuit 260 is configured to process the measure shot output signal DMSOut, and to generate control signals for optimizing the DLL system 200. The illustrated optimization circuit 260 provides the control signals to the replica model 225, the phase detector 240, the shift register controller 242, and the output buffer 220. In one embodiment, the optimization circuit 260 can be configured to optimize at least one of the DLL system components 220, 225, 240, 242 based on the N value so as to permit the faster locking of the DLL system 200. Optionally, the optimization circuit 260 can provide the internal circuits 270 with a control signal. The internal circuits 270 can be configured to optimize the timing of its operation based on the control signal.

Figure 3:
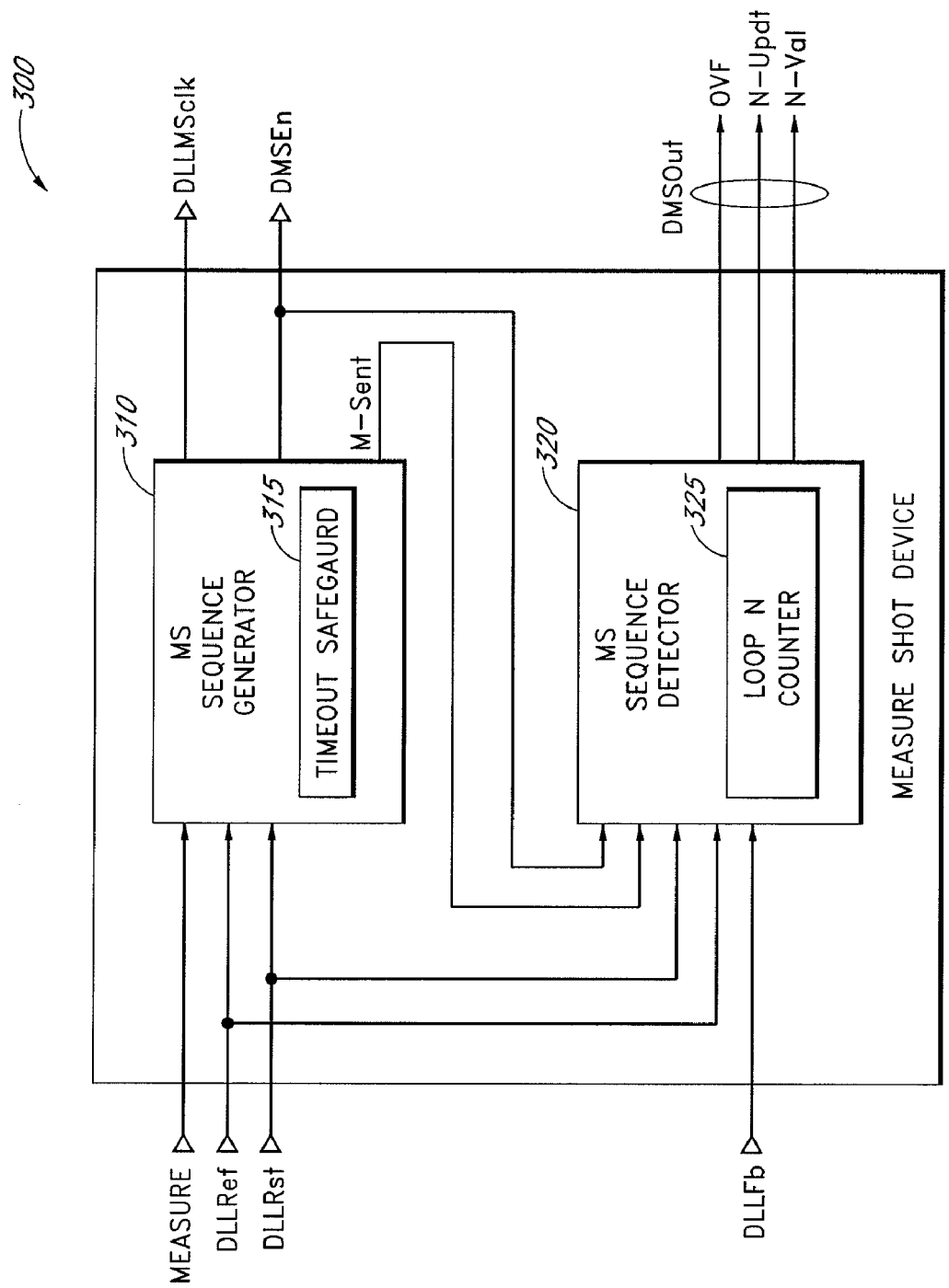
FIG. 3 is a schematic block diagram of one embodiment of the measure shot device of FIG. 2.

FIG. 3 illustrates one embodiment of the measure shot device of FIG. 2. The illustrated measure shot (MS) device 300 includes a measure shot (MS) sequence generator 310 and a measure shot (MS) sequence detector 320.

The measure shot sequence generator 310 is configured to generate a measure shot sequence which is to be applied to the DLL system 200 (FIG. 2). In one embodiment, when the DLL system 200 is idle, the measure initiation signal MEASURE triggers the operation of the measure shot sequence generator 310. Upon receiving the measure initiation signal MEASURE, the measure shot sequence generator 310 starts generating the measure shot clock signal DLLMSclk containing the measure shot sequence. Simultaneously with or immediately after starting generating the measure shot sequence, the measure shot sequence generator 310 generates the measure shot enable signal DMSEn so as to allow the multiplexer 210 to apply the measure shot clock signal DLLMSclk to the DLL system loop. The measure shot sequence generator 310 also generates a measure-sequence-sent signal M_Sent which is indicative of the completion of applying the measure shot sequence into the DLL system loop. The measure shot sequence generator 310 supplies the measure-sequence-sent signal M_sent to the measure shot sequence detector 320 to trigger the operation thereof.

The measure shot sequence generator 310 also includes a timeout safeguard 315. The timeout safeguard 315 is configured to set a maximum time interval for the measure shot device 300 to steal the forward clock path of the DLL system 200 (FIG. 2). The DLL system cannot resume its normal operation while the measure shot device 300 is using the forward clock path. The timeout safeguard 315 prevents the measure shot device 300 from excessively using the forward clock path, thus minimizing or avoiding impact on the normal operation of the DLL system 200. In addition, in case the measure shot sequence is corrupted or lost (i.e., the original measure shot sequence is not recovered by the measure shot device 300), the timeout safeguard 315 can allow the DLL system to resume its normal operation. The timeout safeguard 315 can stop the operation of the entire measure shot device 300 or can only stop the supply of the measure shot enable signal DMSEn to the multiplexer 210 (FIG. 2).

The measure shot (MS) sequence detector 320 is configured to monitor and detect the measure shot sequence which has been applied to the DLL system 200. The measure shot (MS) sequence detector 320 is enabled upon receiving the measure shot enable signal DMSEn from the measure shot sequence generator 310. The measure shot sequence detector 320 monitors the feedback signal DLLFb coming from the replica model 225. If it detects the measure shot sequence, it compares the original measure shot sequence with the detected measure shot sequence to determine whether the original measure shot sequence has been successfully recovered from the DLL system 200 (FIG. 2). If successful, the measure shot sequence detector can generate a measure shot sequence detection signal MS_Det.

The measure shot sequence detector 320 also includes a loop N counter 325 configured to count the number of reference clocks between applying and detecting the measure shot sequence. The loop N counter is enabled by the measure-sequence-sent signal M_sent from the measure shot sequence generator 310. The loop N counter starts counting the number of clocks based on the reference clock signal DLLRef. When the measure shot sequence detector 320 successfully detects the measure shot sequence, the loop N counter 325 stops counting the number of clocks.

The loop N counter 325 generates an N value signal N_val, an N value update signal N_updt, and/or an overflow signal OVF. The N value signal provides information indicative of the number of reference clocks between applying and detecting the measure shot sequence. The N value update signal N_updt provides information indicative of whether the current N value is the same as the one obtained in the immediately previous measure shot device operation. The overflow signal OVF provides information indicative of overflow of the N value. The N value signal N_val, the N value update signal N_updt, and the overflow signal OVF together form the measure shot output signal DMSOut, and are supplied to the optimization circuit 260 (FIG. 2).

The DLL reset signal DLLrst serves to reset the measure shot device 300. In one embodiment, the DLL reset signal DLLrst can be periodically supplied to the measure shot device 300. In another embodiment, the DLL reset signal DLLrst can be provided whenever there is a need to trigger the operation of the measure shot device.

Figure 4A:
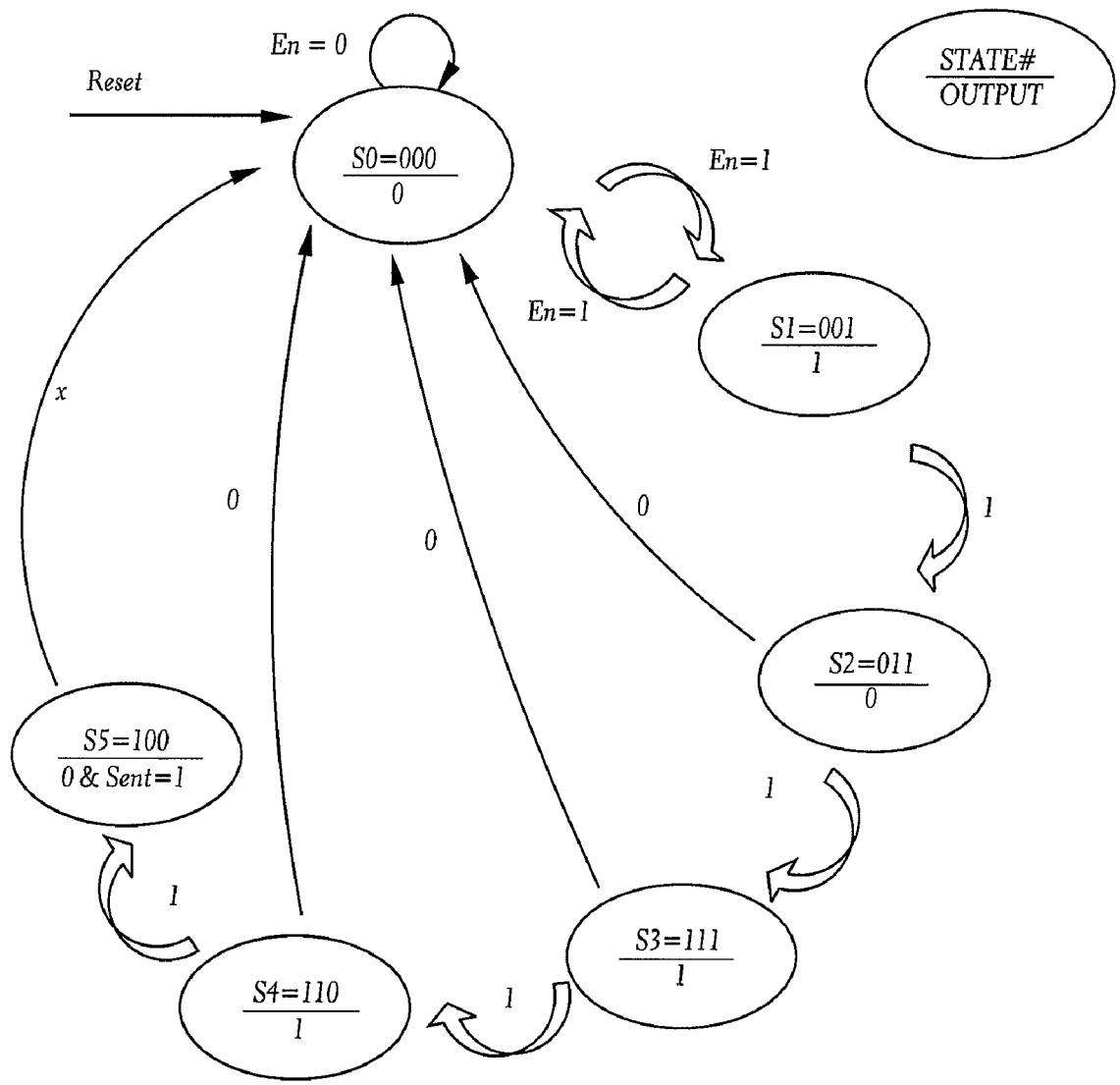
FIG. 4A is a state diagram illustrating one embodiment of a method of generating a measure shot sequence.

FIG. 4A is a state diagram illustrating one embodiment of a method of generating a measure shot sequence. In the illustrated embodiment, Gray Coding is used to encode the measure shot sequence for noise and/or interference immunization. A skilled artisan will appreciate that various other types of coding schemes (e.g., binary code, pseudo-random code, ASCII code, Huffman code, non-return-to-zero (NRZ) line code, and return-to-zero (RZ) line code) can also be adapted for encoding the measure shot sequence.

In FIG. 4A, the measure shot sequence is a six bit sequence based on Gray Coding. The illustrated six bit sequence is "010110." As the state of the measure shot sequence generator 310 (FIG. 3) changes from S0 to S5 in a clockwise direction with enable signals (En=1), outputs 0, 1, 0, 1, 1, 0 are sequentially generated in the clockwise direction. The state numbers S0-S5 are encoded into three bit numbers: 000, 001, 011, 111, 110, and 100, respectively. A skilled artisan will appreciate that the configuration of the measure shot sequence can vary widely depending on the design of the measure shot device 300. In one embodiment, the state diagram of FIG. 4A can be implemented by a logic circuit represented by Boolean logic equations shown in Table 1.

TABLE 1

| | |
|---|---|
| $Q_2^+ = En \cdot Q_1$ | $DllMSEn = DllRst + \overline{Q_2} \cdot \overline{Q_0}$ |
| $Q_1^+ = En \cdot Q_0$ | $DllMSclk = (Q_2 \cdot Q_1 + Q_0 \cdot \overline{Q_1}) \cdot En$ |
| $Q_0^+ = En \cdot \overline{Q_2}$ | $M\_Sent = Q_2 \cdot \overline{Q_1}$ |

In Table 1, $Q_0$, $Q_1$, and $Q_2$ represent the least significant bit (LSB), the second least significant bit, and the most significant bit (MSB), respectively, of one of the encoded state numbers S0-S5 of FIG. 4A. $Q^+$ represents a value of Q in the immediately subsequent state. "En" represents an enable signal shown in FIG. 4A.

Figure 4B:
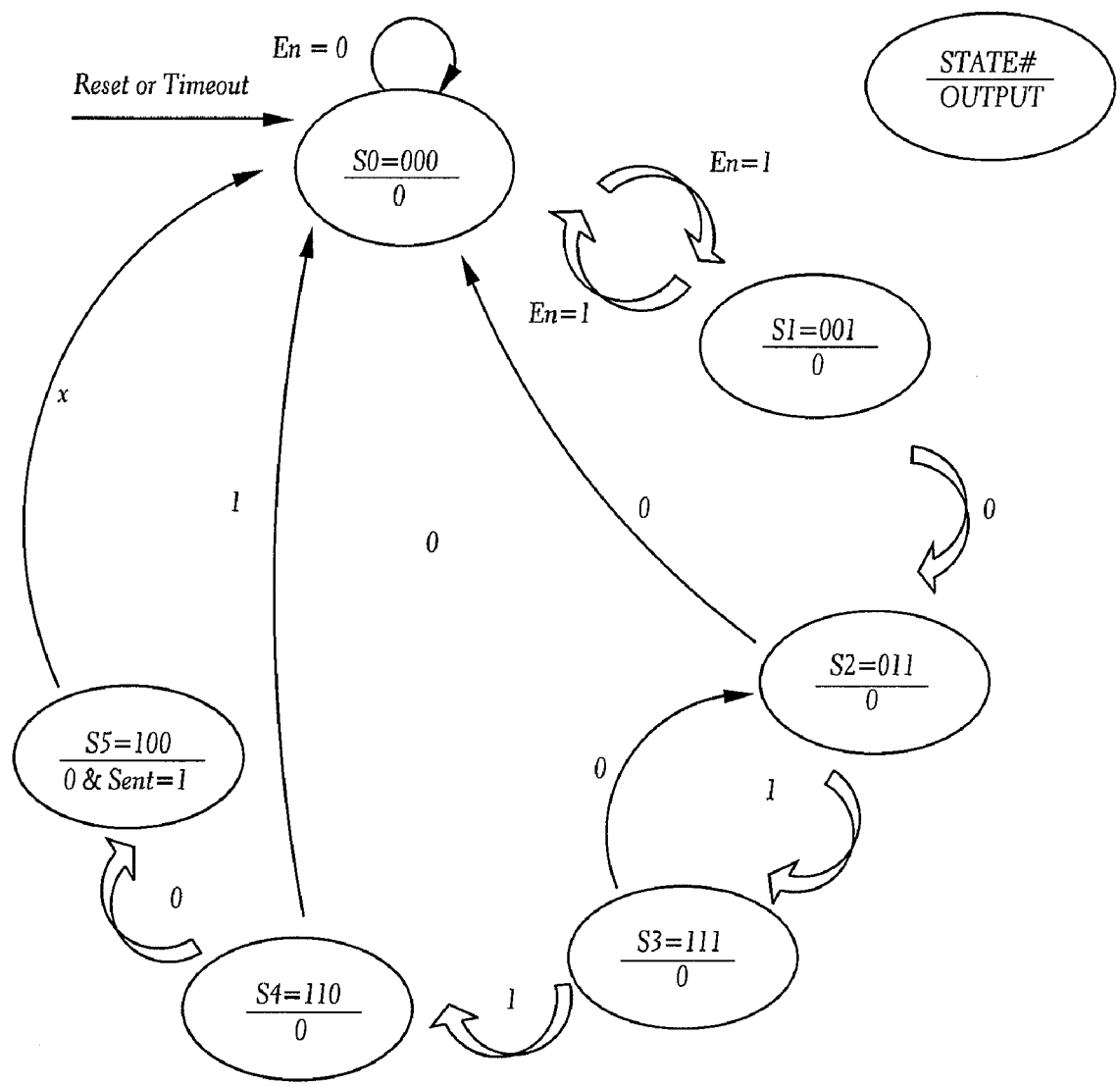
FIG. 4B is a state diagram illustrating one embodiment of a method of detecting a measure shot sequence.

FIG. 4B is a state diagram illustrating one embodiment of a method of detecting a measure shot sequence. The method determines whether a measure shot sequence detected by the measure shot sequence detector 320 (FIG. 3) is identical to the original measure shot sequence which the measure shot sequence generator 310 (FIG. 3) has applied to the DLL system 200 (FIG. 2). In the illustrated embodiment, the original measure shot sequence is "010110" which is shown in FIG. 4A. The method starts with 0 at S0. If a bit recovered next is "1" (En=1), the bit corresponds to the second bit "1" of the original sequence, which indicates that a correct bit has been recovered. The state of the measure shot sequence detector 320 changes to the next state S1. On the other hand, if the bit recovered next is "0" (En=0), it is not identical to the second bit of the original sequence, which indicates a failure of recovering the measure shot sequence. The state remains at S0.

Similarly, at the next state S1, if a bit recovered next is "0," the bit corresponds to the third bit "0" of the original sequence. The state changes to the next state S2. On the other hand, if the bit recovered next is "1," it is not identical to the third bit of the original sequence, which indicates a failure of recovering the measure shot sequence. The state returns to S0. In this manner, the state of the measure shot sequence detector changes clockwise. If all the bits of the original sequence have been successfully recovered, the measure shot sequence detector 320 generates the measure shot sequence detection signal MS_Det, and stops the operations of the loop N counter 325. In one embodiment, the state diagram of FIG. 4B can be implemented by a logic circuit represented by Boolean logic equations shown in Table 2.

TABLE 2

| | |
|---|---|
| $Q_2^+ = (\overline{D} \oplus Q_0) \cdot Q_1$ | $\oplus = XOR$ |
| $Q_1^+ = Q_2 \cdot Q_0 + \overline{D} \cdot Q_0 \cdot \overline{Q_1} + D \cdot \overline{Q_2} \cdot Q_1$ | $MS\_Det = Q_2 \cdot \overline{Q_1}$ |
| $Q_0^+ = \overline{D} \cdot Q_0 \cdot (Q_2 + \overline{Q_1}) + D \cdot \overline{Q_2} \cdot (Q_1 + \overline{Q_0})$ | |

In Table 2, $Q_0$, $Q_1$, and $Q_2$ represent the least significant bit (LSB), the second least significant bit, and the most significant bit (MSB), respectively, of one of the encoded state numbers S0-S5 of FIG. 4B. $Q^+$ represents a value of Q in the immediately subsequent state. "En" represents an enable signal shown in FIG. 4B. D represents an incoming data.

Process of Determining Forward Clock Path Delay

Figure 5:
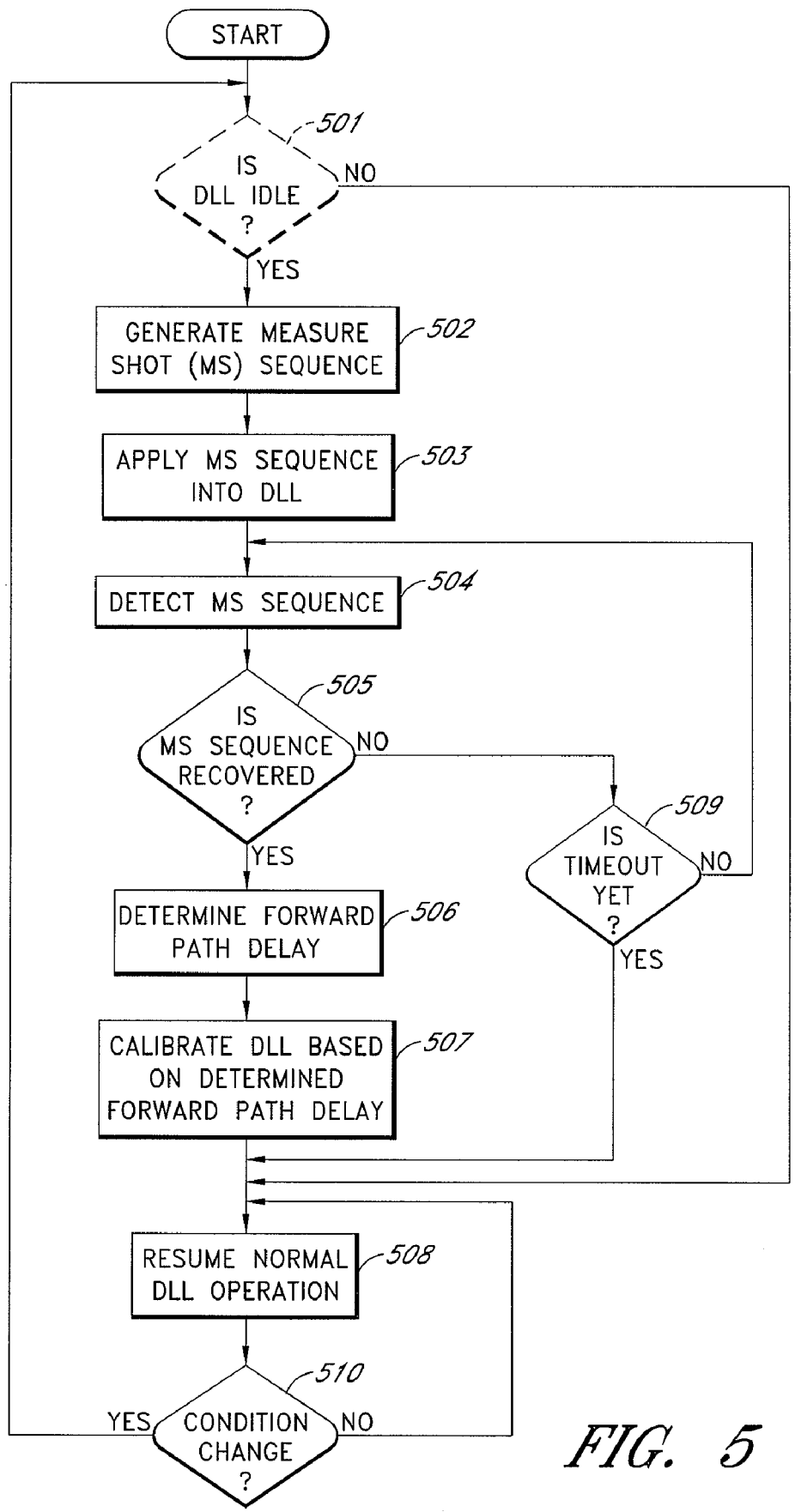
FIG. 5 is a flowchart illustrating one embodiment of a process of measuring a forward clock path delay associated with a DLL system.

Referring to FIGS. 2, 3 and 5, a process of determining the forward clock path delay of a DLL system is described. Some of steps shown in FIG. 5 are optional, and thus can be omitted. In addition, some of the steps can be combined together. In block 501 of FIG. 5, it is determined whether the DLL system 200 (FIG. 2) is idle. If yes, the measure shot sequence generator 310 (FIG. 3) generates a measure shot (MS) sequence in block 502. If no, the DLL system 200 continues its normal operation in block 510. The block 501 is optional. In another embodiment, the process can be carried out even when the DLL system is not idle.

Returning to block 502, after the measure shot sequence has been generated, it is applied to the DLL system in block 503. The measure shot sequence detector 320 monitors and detects the measure shot sequence in block 504. Subsequently, it is determined whether the original measure shot sequence has been recovered in block 505.

If the original measure shot sequence has been successfully recovered, the process proceeds to block 506 in which the forward clock path delay of the DLL system is determined based on the number of reference clocks (N value) between applying and detecting the measure shot sequence. In block 507, the DLL system is calibrated based on the determined forward clock path delay. The DLL resumes its normal operation in block 508.

On the other hand, if the original measure shot sequence has not been successfully recovered in block 505, it is determined whether a timeout has been called in block 509. If yes, the process proceeds to block 508, and the DLL system resumes its normal operation. If no, the process goes back to block 504. The measure shot sequence detector 320 detects the measure shot sequence again.

While the DLL system is in its normal operation, it is determined whether there has been a change in conditions with which the calibration of the DLL system is desirable in block 510. Examples of the conditions include, but are not limited to, operating temperature, external voltage, and external clock frequency. If the conditions have changed, the process goes back to block 501, and reinitiate the entire process for calibrating the DLL system. If not, the DLL system continues its normal operation (block 508). In another embodiment, the DLL system can be configured to wait a predetermined period of time before it returns to block 501, regardless of changing conditions. In yet another embodiment, the DLL system can be calibrated periodically, but not in response to changed conditions. A skilled artisan will appreciate that the DLL system can have various other suitable requirements which can trigger the process of blocks 501-509.

Figure 6:
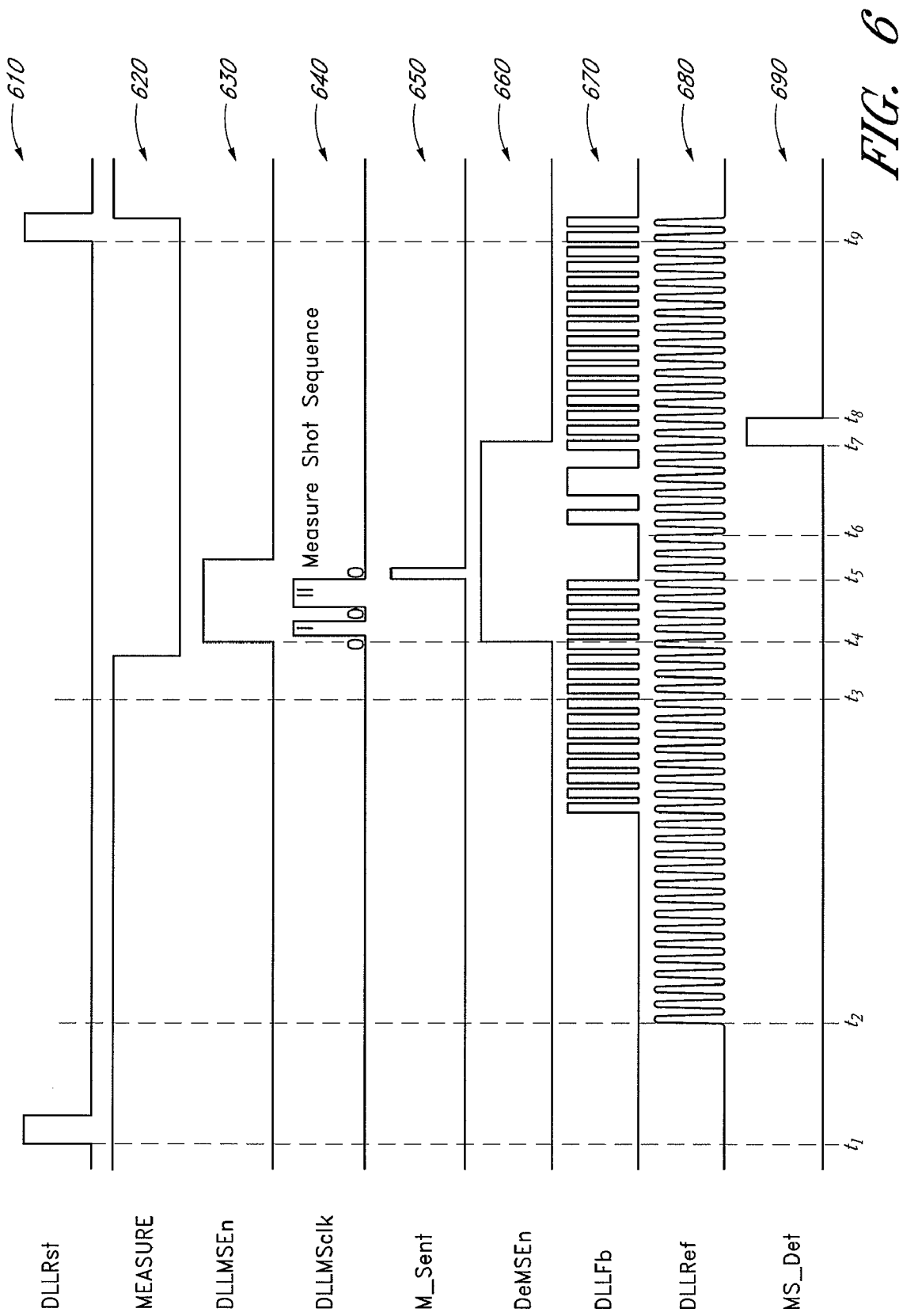
FIG. 6 is a timing diagram illustrating the operation of the measure shot device of FIG. 3.

FIG. 6 is a timing diagram illustrating the operation of the measure shot device of FIG. 3 according to one embodiment. Referring to FIGS. 3 and 6, the DLLRst signal (reset signal) 610 goes high at time t1 so as to reset the measure shot device 300. The MEASURE signal (measure initiation signal) 620 goes low at time t4 to initiate the measure shot sequence generator 310.

The DLLMSclk signal 640 containing a measure shot sequence is generated from the measure shot sequence generator 310 (FIG. 3). In the illustrated embodiment, the measure shot sequence is 010110. The DLLMSEn signal 630 also goes high at time t4 to apply the measure shot sequence to the DLL system 200 (FIG. 2) through the multiplexer 210. The DLLMSEn signal 630 stays high until the completion of applying the measure shot sequence into the DLL system.

When the measure shot sequence has been completely applied to the DLL system 200 at time t5, the M_Sent signal 650 goes high to enable the loop N counter 325 (FIG. 3). Upon receiving the M_Sent signal 650, the loop N counter 325 starts counting the number of clocks at time t5, based on the DLLRef signal 680.

The DLLMSEn signal 630 also triggers a DeMSEn signal 660 to go high at time t4. The DLLMSEn signal 630 enables the measure shot sequence detector 620 while it stays high. The DeMSEn signal starts the measure shot sequence detector 620 immediately after the measure shot sequence generator 310 starts generating the measure shot sequence or in a predetermined short period of time thereafter. This configuration permits saving power. It also allows the measure shot sequence detector 320 to not miss the first piece of the measure shot sequence in case the DLL system is very short in terms of the reference clock number or physical delay time.

The measure shot sequence detector 320 monitors the DLLFb signal 670 which has gone through the DLL system loop. In the illustrated embodiment, the measure shot sequence returns to the measure shot sequence detector 320 at time t6. The measure shot sequence detector determines whether the original measure shot sequence has been successfully recovered. In FIG. 6, it is shown that the measure shot sequence detector 320 generates the MS_Det signal which is indicative of the successful recovery of the measure shot sequence at time t7.

At the same time, the DeMSEn signal 660 goes low to disable the measure shot sequence detector 320. In certain instances, if the measure shot sequence is not recovered within a predetermined time window, the timeout safeguard 315 can control the MEASURE signal so as to disable the measure shot device 300.

When the MS_Det signal 690 goes high at time t7, the loop N counter 325 stops counting the number of reference clocks. It is determined how many clocks have passed between time t5 and time t7, thereby generating a new N value.

A DLL having the measure shot device described above can apply to various electronic devices. Examples of the electronic devices can include, but are not limited to, consumer electronic products, electronic circuits, electronic circuit components, parts of the consumer electronic products, electronic test equipments, etc. Examples of the electronic devices can also include memory chips, memory modules, receiver circuits of optical networks or other communication networks, disk driver circuits, and serializer/deserializer (SerDes). The consumer electronic products can include, but are not limited to, a mobile phone, a telephone, a television, a computer monitor, a computer, a hand-held computer, a personal digital assistant (PDA), a microwave, a refrigerator, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device can include unfinished products.

The measure shot device of the embodiments described above can provide reliable information on a forward clock path delay in term of the number of reference clocks or N value. The measure shot device can use various encoding schemes for design robustness and noise/interference immunization. In addition, the measure shot device can keep updating the N value under varying conditions. This N value can be used for optimizing the components of a DLL system as well as an internal circuit which uses the output clock of the DLL system. This configuration allows effective optimization of the DLL system and the internal circuit. The N value can also be used for future improvement of current DLL systems.

The measure shot device of the embodiments described above can apply to an existing DLL system with a minimal design change. The measure shot device can be implemented as a module into any existing DLL system. In addition, the measure shot device only requires one extra routing to the upper level of the DLL system.

The measure shot device can provide forward path delay information with minimal impact on the DLL system operation. Because the measure shot device uses its own sequence while the DLL system is idle, it does not affect the operation of the DLL system. In addition, the measure shot sequence is relatively short (e.g., equal to or less than 6 bits), and thus minimizes timing budget constraint on the DLL system. Furthermore, the timeout safeguard prevents the measure shot device from excessively using the forward clock path.

One embodiment is a delay-locked loop (DLL) system. The system includes a delay-locked loop (DLL) which includes a configurable delay line. The DLL is configured to receive a clock signal as an input to the DLL. The clock signal has a clock sequence. The system also includes a calibration device configured to provide a calibration code as an input to the DLL and to detect a propagation of the calibration code through the DLL for calibration of the configurable delay line. The calibration code has a sequence different from the clock sequence. The calibration code does not include a string of more than 6 consecutive binary 1's.

Another embodiment is a method of calibrating a delay-locked loop (DLL). The method includes providing a delay-locked loop (DLL) comprising a delay line. The DLL is configured to receive a clock signal as an input to the DLL for normal operation. The clock signal has a clock sequence. A calibration code is provided as an input to the DLL. The calibration code has a sequence different from the clock sequence. The calibration code does not include a string of more than 6 consecutive binary 1's. A propagation of the calibration code through the DLL is detected. A propagation delay through the delay line is selected to calibrate the DLL.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A system comprising:
    a delay line configured to receive a signal encoding a clock sequence; and
    a calibration device configured to determine a delay through a delay locked loop (DLL) that includes the delay line, the calibration device being configured to determine whether a calibration sequence has propagated through the delay locked loop, the calibration sequence being different from the clock sequence, wherein the calibration sequence does not include a long string of consecutive binary 0's and/or consecutive binary 1's.

2. The system of claim 1, wherein the calibration sequence is different from an interrupt of the clock sequence.

3. The system of claim 1, wherein the calibration sequence includes a string containing one or more of 0x110, 11x01, 111101, 11011, 100011, 001100, 1000100, 110010001101111, wherein x is 0 or 1.

4. The system of claim 1, wherein the calibration sequence does not include a string of 16 or more consecutive binary 0's before a binary 1.

5. The system of claim 1, wherein the calibration sequence has a length of at least five reference clock cycles.

6. The system of claim 1, further comprising a multiplexer configured to select between providing the clock sequence to the delay line and applying the calibration sequence to the delay line.

7. The system of claim 1, wherein the calibration device comprises:
    a measure shot sequence generator configured to generate the calibration sequence; and
    a measure shot sequence detector configured to determine a time interval between application of the calibration sequence and detection of the propagation of the calibration sequence through the DLL.

8. The system of claim 7, wherein the measure shot sequence detector is further configured to determine whether a sequence recovered from the DLL matches with the calibration sequence generated by the measure shot sequence generator.

9. The system of claim 7, wherein the calibration device is further configured to stop applying the calibration sequence when the calibration sequence is not detected within a period of time.

10. The system of claim 7, wherein the system is configured to determine when the DLL is idle, and wherein the calibration device is configured to apply the calibration sequence when the DLL is idle.

11. The system of claim 7, wherein the measure shot sequence detector is configured to count the number of reference clock cycles for a period of time between application of the calibration sequence and detection of the propagation of the calibration sequence through the DLL to determine the time interval.

12. The system of claim 11, wherein the measure shot sequence detector is configured to count the number of reference clock cycles based at least partly on the signal.

13. The system of claim 1, wherein the system is further configured to determine whether there has been a change in operating conditions with which the calibration of the DLL is desirable.

14. An apparatus comprising:
    a delay-locked loop (DLL) comprising a configurable delay line;
    a calibration device configured to generate a calibration sequence; and
    a multiplexer configured to select between providing a clock signal to the DLL and applying the calibration sequence to the DLL, the clock signal having a clock sequence, the calibration sequence being different from the clock sequence,
    wherein the calibration device is further configured to determine whether the calibration sequence has propagated through the DLL.

15. The apparatus of claim 14, wherein the multiplexer is configured to provide the clock signal to the delay line during a normal mode and to provide the calibration sequence to the delay line during a calibration mode.

16. The apparatus of claim 15, wherein the multiplexer is configured to receive the clock signal during the calibration mode.

17. A method comprising:
    applying a calibration sequence to a delay line of a delay locked loop (DLL), the calibration sequence being different from a clock sequence encoded by a clock signal received as an input to the DLL, wherein the calibration sequence does not include a long string of consecutive binary 0's and/or consecutive binary 1's;
    determining whether the calibration sequence has propagated through the DLL; and
    changing a delay amount of the delay line.

18. The method of claim 17, wherein applying the calibration sequence comprises selecting between providing the clock sequence to the delay line and applying the calibration sequence to the delay line.

19. The method of claim 17, wherein further comprising determining a time interval between application of the calibration sequence and determination of the propagation of the calibration sequence through the DLL.

20. The method of claim 19, wherein determining the time interval comprises counting the number of reference clock cycles for a period of time between application of the calibration sequence and determination of the propagation of the calibration sequence through the DLL.

21. The method of claim 20, wherein determining the time interval comprises counting the number of reference clock cycles based at least partly on the clock signal.

22. The method of claim 17, further comprising determining when the DLL is idle, wherein applying the calibration sequence comprises applying the calibration sequence when the DLL is idle.

23. The method of claim 22, wherein the calibration sequence is provided to the DLL without clearing the clock signal from the DLL.

24. The method of claim 17, further comprising stopping applying the calibration sequence when the calibration sequence is not detected within a period of time.

25. The method of claim 17, further comprising determining whether there has been a change in operating conditions with which the calibration of the DLL is desirable.

* * * * *